United States Patent
Li et al.

(10) Patent No.: US 11,693,066 B2
(45) Date of Patent: Jul. 4, 2023

(54) SIGNAL PROCESSING CIRCUIT FOR REDUCING RIPPLE IN AN OUTPUT SIGNAL OF A SPINNING CURRENT HALL SENSOR AND SIGNAL PROCESSING METHOD

(71) Applicant: Infineon Technologies AG, Neubiberg (DE)

(72) Inventors: Yongjia Li, Jiang Su (CN); Umberto Aracri, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 124 days.

(21) Appl. No.: 17/117,312

(22) Filed: Dec. 10, 2020

(65) Prior Publication Data

US 2021/0181272 A1    Jun. 17, 2021

(30) Foreign Application Priority Data

Dec. 12, 2019   (DE) .......................... 102019134077.2

(51) Int. Cl.
*G01R 33/07* (2006.01)
*G01R 33/54* (2006.01)
*H03F 1/02* (2006.01)

(52) U.S. Cl.
CPC .......... *G01R 33/075* (2013.01); *G01R 33/54* (2013.01); *H03F 1/02* (2013.01)

(58) Field of Classification Search
CPC .. G01R 33/075; G01R 33/54; G01R 33/0041; H03F 1/02
See application file for complete search history.

(56) References Cited

U.S. PATENT DOCUMENTS

| 2014/0077873 | A1  | 3/2014 | Motz et al. | |
| 2016/0370440 | A1* | 12/2016 | Okatake | G01R 33/0029 |
| 2020/0319272 | A1* | 10/2020 | Romero | G01R 33/0041 |

* cited by examiner

*Primary Examiner* — Jay Patidar
(74) *Attorney, Agent, or Firm* — Harrity & Harrity, LLP

(57) ABSTRACT

Signal processing circuit for a Hall sensor and signal processing method. Signal processing circuits for four-phase spinning Hall magnetic field sensors, corresponding methods and corresponding magnetic field sensor apparatuses are provided. In this case, a correction signal (c) is generated on the basis of a first feedback signal (fb1) and a second feedback signal (fb2), wherein the first feedback signal (fb1) is provided with a shorter signal propagation time than the second feedback signal (fb2).

20 Claims, 4 Drawing Sheets

SIGNAL PROCESSING CIRCUIT FOR REDUCING RIPPLE IN AN OUTPUT SIGNAL OF A SPINNING CURRENT HALL SENSOR AND SIGNAL PROCESSING METHOD

RELATED APPLICATION

This application claims priority to German Application No. 102019134077.2 filed Dec. 12, 2019, which is incorporated herein by reference in its entirety.

FIELD

The present application relates to signal processing circuits and to signal processing methods for Hall sensors and to magnetic field sensor apparatuses having such Hall sensors and signal processing circuits.

BACKGROUND

Magnetic field sensor apparatuses for measuring a magnetic field are used in a multiplicity of applications, for example for detecting movements. In such applications, a movement of an element causes a change in a magnetic field which is then captured by a magnetic field sensor apparatus.

Hall sensors are one type of magnetic field sensors which are used in such magnetic field sensor apparatuses. In some implementations, Hall sensors have four connections, wherein a bias current is applied to two connections and a Hall voltage is tapped off at the two other connections, the magnitude of which voltage depends on a magnetic field component perpendicular to a plane of the Hall sensor.

In order to reduce an offset, such Hall sensors are operated in some implementations using a so-called spinning current technique. In this technique, the connections which are used to apply the bias current and to tap off the Hall voltage change in different operating phases, and an offset can then be computationally removed and therefore reduced by combining the voltages tapped off in different operating phases. In this case, two-phase spinning schemes and four-phase spinning schemes are used, in which case four-phase schemes generally provide a better reduction in the offset. Such techniques are often combined with chopping at a frequency corresponding to the changing of the phases.

In this case, filtering is necessary in order to eliminate or at least reduce ripple in the output signal at the frequency of the spinning current (that is to say the frequency at which the operating phases change).

A conventional technique for this is to use a two-phase feedback loop, which may be insufficient, however, at high frequencies, for example above 250 kHz.

In a conventional solution for such high frequencies, parallel notch filter stages are used in a signal path which is coupled to a Hall sensor. In this solution, sampling effects may occur in the output signal if the magnetic field changes quickly and an input signal of the signal path therefore has a step.

SUMMARY

A signal processing circuit and a signal processing method are provided.

One or more embodiments provides a signal processing circuit including:

a combiner for receiving an output signal from a four-phase spinning current Hall sensor and a correction signal and for combining the output signal and the correction signal to form a corrected signal, a main signal path which is configured to receive the corrected signal and to output an output signal, a second signal path which branches off from a node within the main signal path and is configured to provide a first feedback signal, wherein the second signal path has a shorter signal propagation time than the main signal path, and a processing device which is configured to generate the correction signal for reducing ripple in the output signal on the basis of the first feedback signal and the output signal as a second feedback signal.

One or more embodiments provides a signal processing method including:

providing a second feedback signal from an output of a main signal path which is coupled to a four-phase spinning current Hall sensor, providing a first feedback signal which is diverted from a node within the main signal path, wherein the first feedback signal is provided with a shorter signal propagation time than the second feedback signal, and generating a correction signal for an output signal from the Hall sensor on the basis of the first feedback signal and the second feedback signal.

The above summary is used merely as a brief overview of some embodiments and should not be interpreted as being restrictive.

DETAILED DESCRIPTION

Various example embodiments are explained in detail below with reference to the accompanying drawings. These example embodiments are used merely for explanation and should not be interpreted as being restrictive. In other example embodiments, some of the illustrated features (components, elements, operations and the like) may thus be omitted and/or replaced with alternative features or components. In addition to the explicitly illustrated and described features, further features, for example features conventionally used in magnetic field sensor apparatuses, can be provided.

Features of different example embodiments may be combined with one another, unless stated otherwise. For example, some variations, modifications and alternatives are described only in relation to one example embodiment in order to avoid repetitions, but may also be applied to other example embodiments.

Connections or couplings which are described below relate to electrical connections or couplings, unless stated otherwise. Such electrical connections or couplings can be modified, for example by providing additional elements or by omitting elements, as long as the fundamental function of the electrical connection or coupling, for example the transmission of a signal, the transmission of an item of information, the provision of a voltage or the provision of a current, is not substantially changed.

Figure 1:
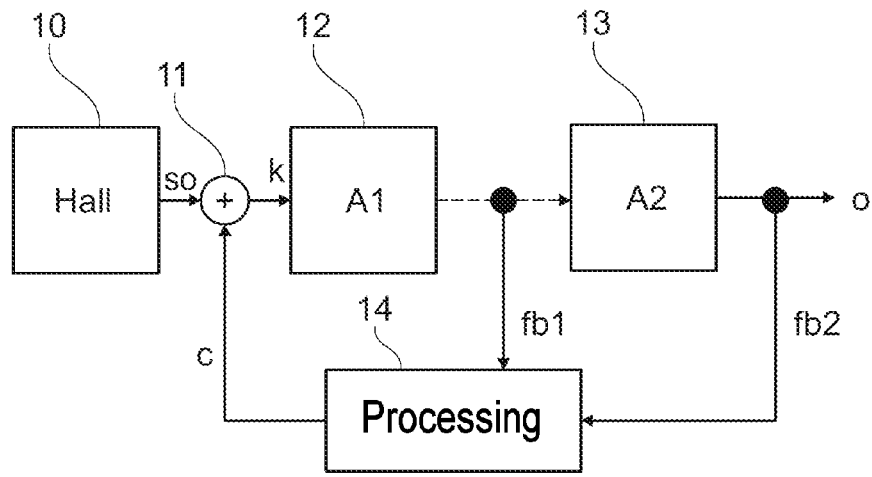
FIG. 1 is a block diagram of a magnetic field sensor apparatus according to one example embodiment.

FIG. 1 shows a magnetic field sensor apparatus according to one example embodiment which comprises a signal processing circuit according to one example embodiment.

As a magnetic field sensor, the magnetic field sensor apparatus in FIG. 1 has a Hall sensor 10. The Hall sensor 10 is operated using a spinning current technique and, in implementations, using a four-phase spinning current technique, as was briefly mentioned in the introductory part of the description and will also be explained in yet more detail further below with reference to FIGS. 2A and 2B. The circuit components used for this purpose, such as switches for optionally applying a bias current to different connections, corresponding current or voltage sources and switches for optionally tapping off the Hall voltage at different connections, can be implemented in any conventional manner and are therefore not explicitly illustrated.

An output signal so from the Hall sensor 10, that is to say the Hall voltage which has been tapped off or a signal derived therefrom, is supplied to a first input of an adder 11. A correction signal c, the generation of which is described in more detail below and which is used to filter out, that is to say eliminate or at least reduce, ripple, is supplied to a second input of the adder 11. In this case, the term "adder" should generally be understood as meaning an element which combines two signals and can also subtract (depending on the sign convention used) the signals, for example, and can also be generally referred to as a combiner.

An output signal k corrected in this manner from the adder 11 is supplied to a main signal path having a first amplifier stage 12 followed by a second amplifier stage 13. An output signal o can be tapped off at an output of the second amplifier stage 13. It should be noted that the main signal path may also have yet further interposed elements, as indicated by the dashed line between the amplifiers 12 and 13. The amplifier stages 12 and 13 are also used merely as examples of possible elements in a signal path, and other components are also possible, as will also be explained below on the basis of examples.

In order to form the correction signal c, a first feedback signal fb1 is tapped off within the main signal path between the amplifier 12 and the amplifier 13 and a second feedback signal fb2 corresponding to the output signal o is tapped off at the output of the main signal path. The first feedback signal fb1 and the second feedback signal fb2 are supplied to a processing means 14. The processing means 14 may comprise a digital processing means, for which the feedback signals fb1, fb2 are digitized. The digitization can be carried out using a track-and-hold circuit or a sample-and-hold circuit followed by an analog/digital converter, in which case a single circuit of this type can also be used for both feedback signals fb1, fb2 by means of a multiplexer. Examples of this are explained in yet more detail later. A 1-bit digital/analog converter can be used as the digital/analog converter. Such a digital processing means can be implemented by means of any components which enable the analog/digital conversion of the signals fb1, fb2, the digital processing of the signals converted in this manner and the digital/analog conversion of the result in order to form the correction signal c. For example, 1-bit or multi-bit analog/digital and digital/analog converters, signal processors, logic circuits, counters, multi-purpose processors and the like can be used.

In the case of a four-phase spinning current technique, the first feedback signal fb1 can be combined from two successive phases, whereas the second feedback signal fb2 is combined over all four phases in order to form the correction signal c.

Since the feedback signal fb1 is tapped off within the main signal path, faster feedback is possible here than with the signal fb2, which, in some example embodiments, in particular at high frequencies, can result in a better reduction in ripple than in the case of simple feedback from the output of the main signal path. A simple implementation can be enabled by the digital processing. The digital processing can be carried out by simply incrementing and decrementing the correction signal on the basis of the feedback signals fb1, fb2 digitized by means of a 1-bit conversion. Examples of this are likewise explained in yet more detail later. The correction signal c can then be generated by means of digital/analog conversion at the output of the processing means 14.

Before the approaches with two feedback signals and digital processing which are explained with reference to FIG. 1 are explained in more detail on the basis of FIGS. 3 to 5, the spinning current techniques, as is used in various example embodiments, shall now be explained in more detail with reference to FIGS. 2A and 2B.

Figure 2A:
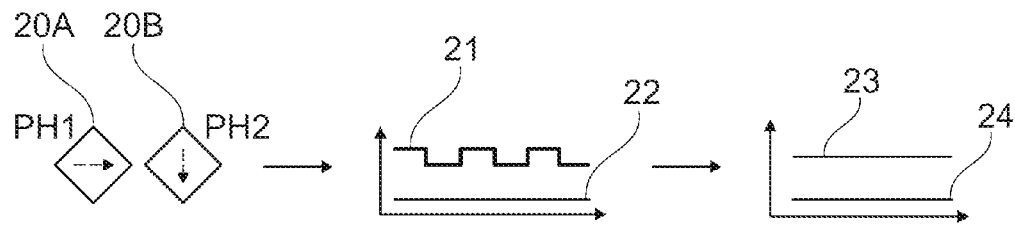
FIGS. 2A and 2B show diagrams for illustrating spinning current techniques.
Figure 2B:
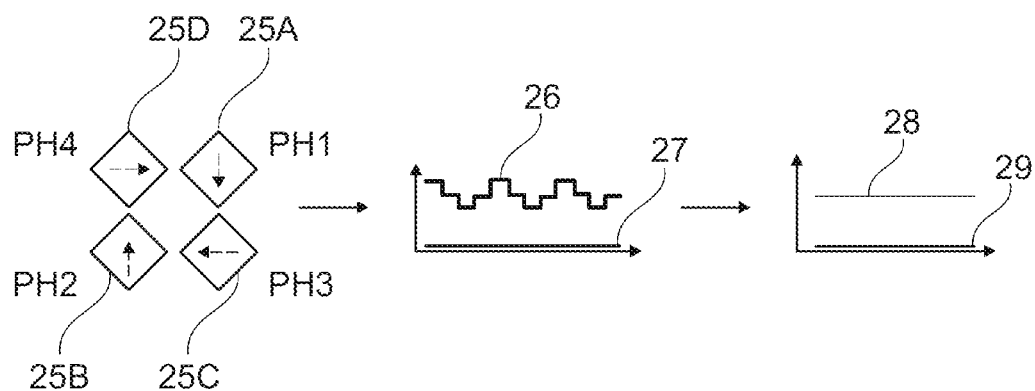

In this case, FIG. 2A shows a two-phase spinning current technique, whereas FIG. 2B shows a four-phase spinning current technique.

It should be noted that the signals illustrated in FIG. 2 and signals illustrated in other figures are used merely for illustration, and actual signal profiles may depend on the exact implementation and also on an applied magnetic field which is measured by the Hall sensor.

A Hall sensor 20 is schematically illustrated in two phases in FIG. 2A and is denoted using the reference sign 20A or 20B, wherein the phases are also denoted using PH1 and PH2. In this case, the Hall sensor is illustrated as a square, wherein a first current is impressed at two corners of the opposite square and the Hall voltage is then tapped off at the other two opposite corners. Dashed arrows for the Hall sensors 20A, 20B show the direction of the bias current in the two phases PH1, PH2.

A curve 21 shows an example of a resulting signal, and a curve 22 shows the offset. A processing signal C can be used to smooth the signal, as illustrated in a curve 23, in order to eliminate ripple, whereas the offset remains low, as represented by a curve 24.

FIG. 2B shows a four-phase spinning current technique. In this case, a Hall sensor in four phases PH1-PH4 is identified using the reference signs 25A to 25D, in which case dashed arrows again indicate the direction of the bias current. Whereas the bias current is impressed in two directions which are perpendicular to one another in FIG. 2A, the bias current is also impressed with two different polarities for each direction (illustrated as vertical and horizontal in FIGS. 2A and 2B) in FIG. 2B, which results in a total of four phases.

A resulting signal is illustrated in a curve 26, in which case an offset is reduced to a greater extent here, as illustrated by a curve 27, than in the curve 22 in FIG. 2A. The correction signal c can again be used here to smooth the signal, as illustrated by a curve 28, that is to say the ripple can be eliminated or at least reduced, whereas the offset remains low, as illustrated by a curve 29.

If the Hall voltages in the phases 25A, 25B, 25C and 25D are denoted using V1, V2, V3 and V4, the following applies to the Hall voltage $V_{Hall}$ which is caused by the magnetic field:

$$VHall = V1 - Vos1 - Vos3 \quad (1)$$

$$VHall = V2 + Vos1 - Vos3 \quad (2)$$

$$VHall = V3 - Vos2 + Vos3 \quad (3)$$

$$VHall = V4 + Vos2 + Vos3 \quad (4)$$

In this case, Vos1, Vos2 are offsets which stem from different resistances in the two opposite directions of two successive phases in each case, whereas Vos3 is a component which stems from the anisotropy of the sensor (different behavior in the phases 25A, 25C and different behavior in the phases 25B, 25D).

The offsets Vos1 to Vos3 can be calculated from the equations as follows:

$$Vos1 = (V1 - V2)/2 \quad (5)$$

$$Vos2 = (V3 - V4)/2 \quad (6)$$

$$Vos3 = (V1 + V2 - V3 - V4)/4 \quad (7)$$

As is clear, the actual Hall voltage $V_{Hall}$ and therefore the measured magnetic field freed from the offsets Vos1-Vos3 can then be determined from each of the voltages V1 to V4 by means of equations 1 to 4.

In example embodiments, the slower feedback signal fb2 is used to calculate the offset Vos3, whereas the feedback signal fb1 is used to calculate the offsets Vos1 and Vos2.

The correction signal c can then be determined by combining the offsets in each phase according to equations 1 to 4.

Figure 3:
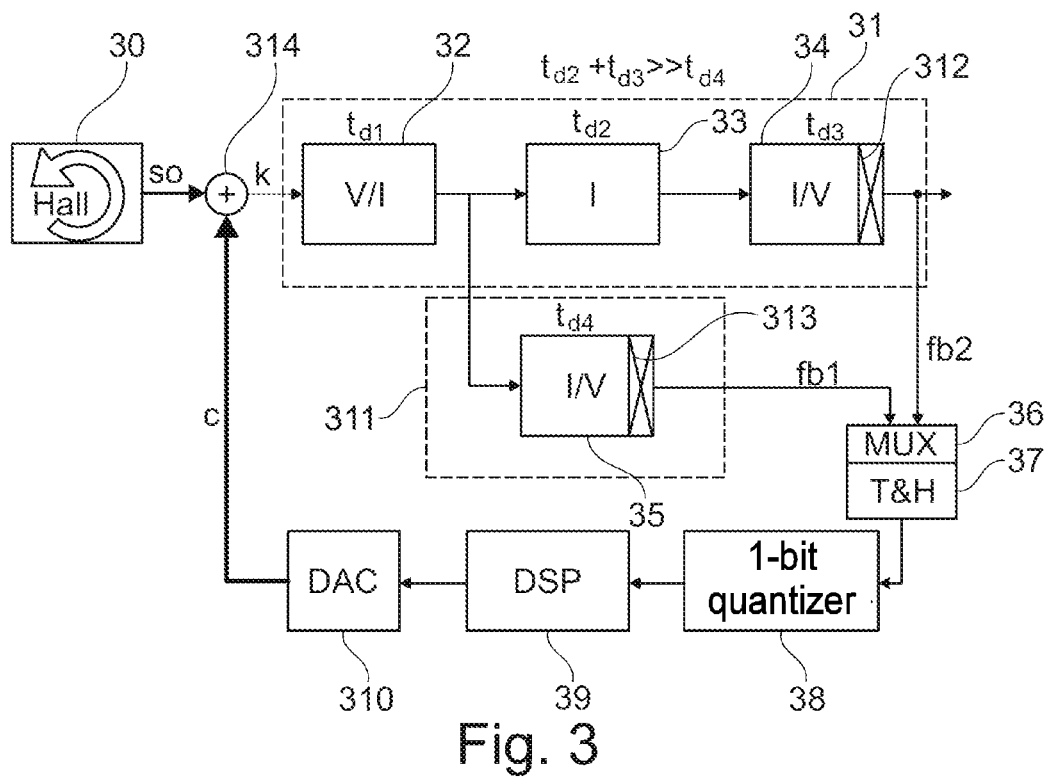
FIG. 3 shows a block diagram of a magnetic field sensor apparatus according to one example embodiment.

FIG. 3 shows a block diagram of a magnetic field sensor apparatus having a signal processing circuit according to a further example embodiment.

The example embodiment in FIG. 3 comprises a Hall sensor 30 having a downstream signal processing circuit. As already described for the Hall sensor 10 in FIG. 1, the Hall sensor 30 is operated using a spinning current scheme and is operated using a four-phase spinning current scheme in the example embodiment in FIG. 3.

The Hall sensor 30 outputs a Hall voltage so to an adder 314 which corresponds to the adder 11 in FIG. 1.

The adder 314 also receives a correction signal c and combines the latter with the signal so to form a corrected signal k. In the example in FIG. 3, the signals so, c and k are each voltage signals. Whereas the signals are denoted using individual arrows, they may also be differential signals. The signal so may thus be a differential Hall voltage which, as explained with reference to FIG. 2, is tapped off at two opposite points, for example corners, of the Hall sensor 30.

The signal k is supplied to a main signal path 31 which then outputs an output signal o corresponding to the signal o in FIG. 1. The main signal path 31 comprises a voltage/current (V/I) converter 32, one or more processing devices 33 which operate in the current range, that is to say use the current signal used by the current/voltage converter 32, and a current/voltage converter 34 which converts the current signal output by the processing device 33 into the voltage signal o.

In one example embodiment, the voltage/current converter 32 may comprise, for example, a transconductance amplifier or a plurality of transconductance amplifiers. The voltage/current converter 32 has a signal propagation time $t_{d1}$. The processing device 33 may comprise one or more current mirrors, for example. The processing device 33 has a signal propagation time $t_{d2}$. The current/voltage converter 34 may be implemented as a transimpedance amplifier, for example, and has a signal propagation time $t_{d3}$, with the result that a total signal propagation time, also referred to as latency, of the main signal path is $t_{d1} + t_{d2} + t_{d3}$.

However, the components 32, 33 and 34 are only one example and other components, for example components operating in the voltage range, can also be used in other example embodiments.

The signal is tapped off between the voltage/current converter 32 and the processing device 33 and is supplied to a current/voltage converter 35 which provides a second signal path 311 for providing a first feedback signal fb1 having a shorter signal propagation time. The current/voltage converter 35 may likewise be configured as a transimpedance amplifier and has a signal propagation time $t_{d4}$. In this case, $t_{d4}$ is considerably lower than the sum of $t_{d2}$ and $t_{d3}$, for example at least by a factor of 2, at least by a factor of 3 or at least by a factor of 5. The second signal path 311 can also be referred to as a replica path for the main signal path 31 and has a similar behavior in a certain manner (for example it likewise in turn outputs a voltage signal), but has a shorter signal propagation time. In the example in FIG. 3, the processing device 33 has been omitted, for example, whereas the current/voltage converter 35 can be constructed in a manner corresponding to the current/voltage converter 34, but may also be a simpler current/voltage converter having a shorter signal propagation time. The signal at the outputs of the current/voltage converters 34, 35 can be respectively chopped at a chopper frequency tchop corresponding to the frequency of the spinning current method. This is indicated by choppers 312, 313 in FIG. 3.

The output signal from the second signal path 311 is supplied, as the first feedback signal fb1, to a multiplexer 36 having a track-and-hold device 37 (T&H) connected downstream. The track-and-hold device 37 operates at the same frequency as the spinning current technique, and the multiplexer 36 changes over between the signal fb1 and the signal fb2, for example after each run through all four phases. In this case, the signal fb1 is used to ultimately compensate for two-phase ripple (caused by the opposite directions of the current, see FIGS. 2A and 2B), whereas the feedback signal fb2 is used to compensate for the ripple which is additionally caused by the directions of the bias current which are perpendicular to one another.

The output signal from the track-and-hold device 37 is digitized by an analog/digital converter 38, a 1-bit quantizer in the example in FIG. 3, and is processed further by a digital signal processor. The 1-bit quantizer can operate substantially as a comparator which compares its input signals with a threshold value and indicates a 0 or 1 depending on the comparison. If differential input signals are used for the comparator, the threshold value can be selected to be differential 0 V (that is to say a voltage difference of 0 between the differential input signals). In the case of a single-pole signal with respect to a reference potential, a threshold value corresponding to 0 V for a differential signal can be selected. In this case, the digital signal processor 39 calculates a digital version of the correction signal c from the samples. As explained later with reference to FIG. 5, the digital signal processor 39 may comprise counters. However, more complex calculations are also possible. The basis in this case is equations (1) to (4) which were explained above with reference to FIG. 2B and from which the useful signal and the offset can be calculated and from which the offset can therefore be compensated for.

The output signal from the digital signal processor 39 is then subjected to digital/analog conversion by a digital/analog converter 310 in order to form the correction signal c.

Figure 4:
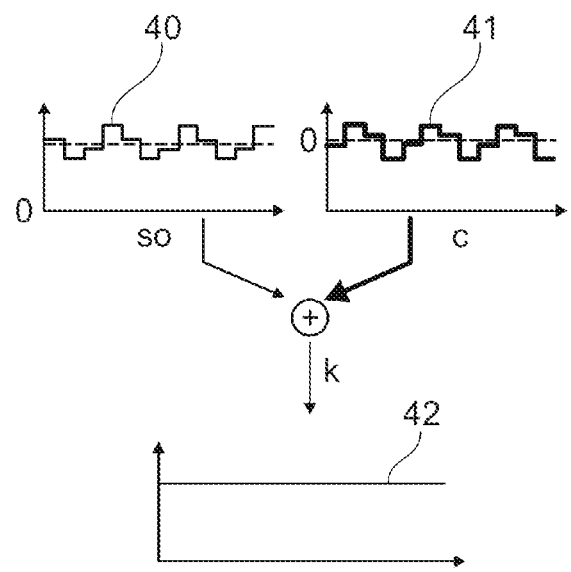
FIG. 4 shows example signals in the magnetic field sensor apparatus in FIG. 3.

For further explanation, FIG. 4 shows examples of the signals so, c and k in FIG. 3. In this case, a curve 40 shows an example of the signal so output by the Hall sensor 30.

A curve 41 shows an example of the profile of a corresponding correction signal c which is substantially inverse to the ripple in the curve 40. A curve 42 shows a corresponding example of the corrected signal k in which the ripple is suppressed.

Figure 5:
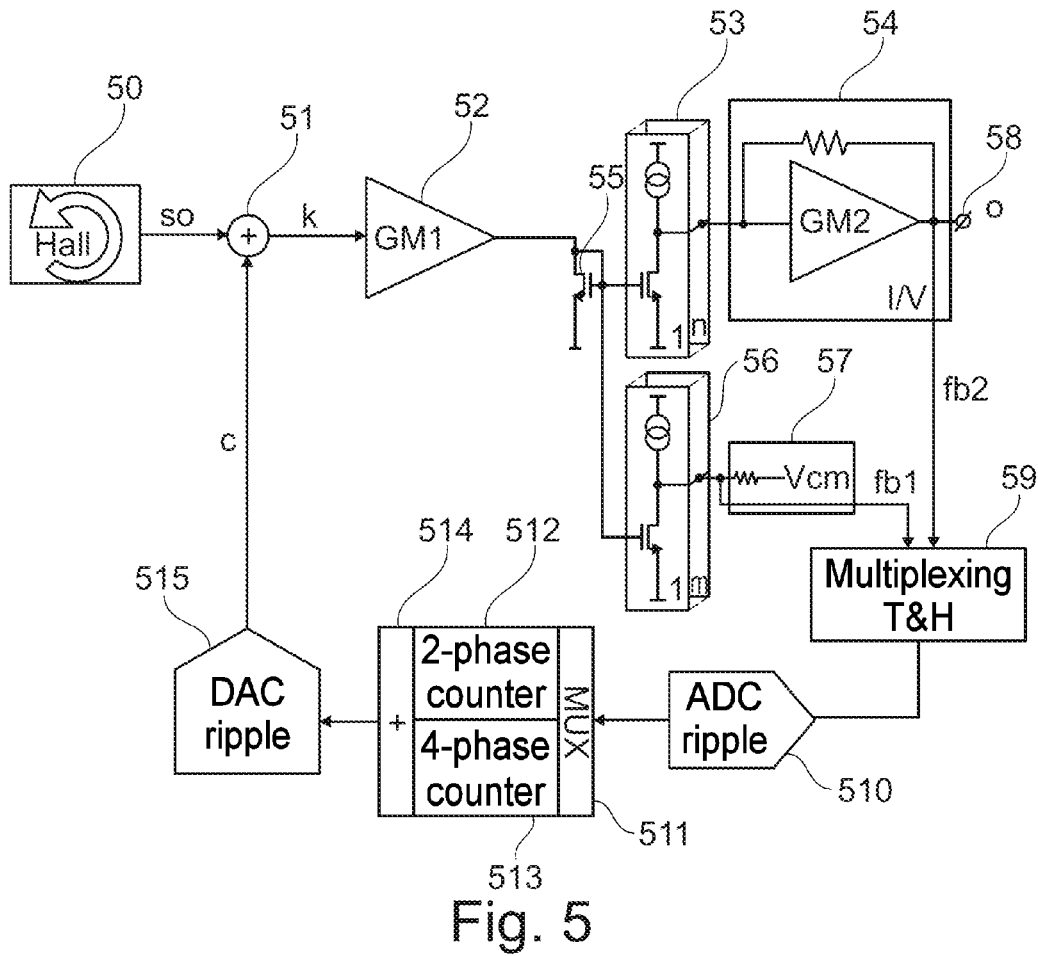
FIG. 5 shows a circuit diagram of a magnetic field sensor apparatus according to one example embodiment.

FIG. 5 shows a circuit diagram of a magnetic field sensor apparatus having a signal processing circuit according to a further example embodiment. The magnetic field sensor apparatus in FIG. 5 comprises a Hall sensor 50 which is operated using a four-phase spinning current technique and outputs a Hall voltage so. The Hall voltage so is supplied to an adder 51, the function of which corresponds to the adders 11 in FIGS. 1 and 311 in FIG. 3. The adder 51 combines the signal so with a correction signal c in order to output a corrected signal k.

The corrected signal k is supplied to a transconductance amplifier 52 which converts it into a current signal. This current signal is supplied to a first transistor 55 in a sequence of first current mirrors 53, n current mirrors in FIG. 5, which are an example of a processing device in the current range.

An output of the n first current mirrors 53 is connected to an input of a transimpedance amplifier 54 which generates the output signal o as a voltage signal and also outputs a second feedback signal fb2 corresponding to the output signal o.

Furthermore, the transistor 55 is used as a first transistor in a sequence of second current mirrors 56, wherein m second current mirrors 56 are provided here. In this case, m is less than n in some example embodiments in order to provide a second signal path having a shorter signal propagation time. An output of the second current mirrors 56 is supplied to a current/voltage converter 57 which, in the example in FIG. 5, is formed substantially by a resistor which is connected to a common-mode voltage Vcm. The output current of the second current mirrors 56 causes a voltage drop across the resistor and therefore a current/voltage conversion. This current/voltage converter 57 may have a shorter signal propagation time than the transimpedance amplifier 54. Overall, in the example embodiment in FIG. 5, a main signal path through the first current mirrors 53 and the transimpedance amplifier 54, which outputs the second feedback signal fb2, has a greater signal propagation time than the signal path through the second current mirrors 56 and the current/voltage converter 57 which outputs a first feedback signal fb1.

The feedback signals fb1 and fb2 are supplied to a multiplexing track-and-hold device 59, the function of which corresponds to the multiplexer 56 and the track-and-hold device in FIG. 3. The signal output by the device 59 is digitized by an analog/digital converter 510, for example a 1-bit quantizer, and is supplied to a digital processing device which can be implemented, for example, by means of a digital signal processor such as the digital signal processor 39 in FIG. 3.

The digital signal is multiplexed using a multiplexer function 511 and is divided in this case into the samples corresponding to the digitized feedback signal fb1 and samples corresponding to the digital feedback signal fb2. The samples which correspond to the second feedback signal fb2 control a four-phase counter 513 which counts up or down depending on a comparison of the samples with a threshold value which may correspond to a mean value. The direction of counting up or down can be selected on the basis of the sampling phase, with the result that Vos3 is substantially calculated according to equation (7). In a similar manner, the samples which correspond to the first feedback signal fb1 are supplied to a two-phase counter 512 which substantially calculates Vos1 and/or Vos2 according to equations (5) and (6) by counting up and down. The outputs from the counters 512, 513 are added using an addition function 514 and are converted into the analog correction signal c by means of a digital/analog converter 515. In this case, in one implementation, the counters 512, 513 generate a differential 0 signal in a center position of a control range of the feedback signals fb1, fb2, with the result that the center position does not contribute anything to the correction signal c. Furthermore, the counters 512, 513 generate +/−differential signals for compensating for the ripple, which are then converted into corresponding components of the correction signal c by the digital/analog converter 515.

Figure 7:
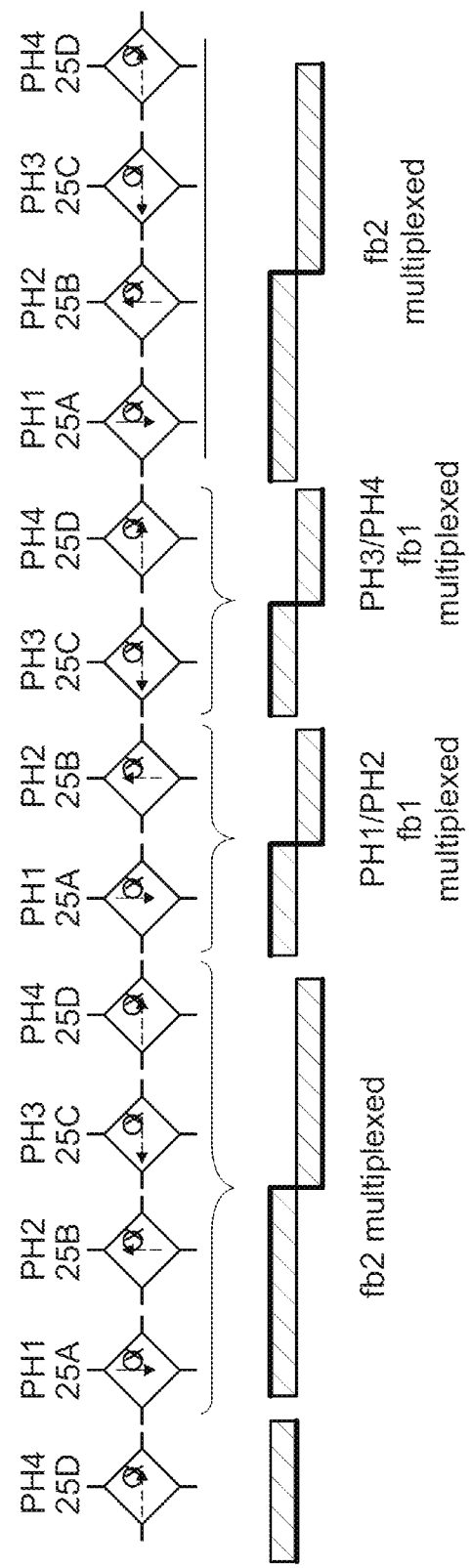
FIG. 7 is a diagram for illustrating multiplexing, as is used in some example embodiments.

The function of the multiplexer 36 in FIG. 3 or of the multiplexing and track-and-hold device 59 in FIG. 5 is explained in yet more detail on the basis of FIG. 7.

FIG. 7 shows the operation of the spinning Hall sensor in FIG. 2B over a longer period, wherein the reference signs 25A to 25D denote the Hall sensors in the corresponding phases PH1 to PH4 in FIG. 2B. For each run through all four phases, either the signal fb2 or the signal fb1 is forwarded. On the basis of the signal fb2 (fb2 multiplexed in FIG. 7), a calculation is carried out on the basis of all phases, for example the calculation of Vos3 according to equation (7), whereas, on the basis of the signal fb1, calculations are carried out on the basis of two phases (PH1/PH2 multiplexed and PH3/PH4 multiplexed), for example according to equations (5) and (6). However, other multiplexing schemes are also possible. For example, the multiplexer can be reorganized during each phase, with the result that both feedback signals fb1, fb2 are continuously evaluated. The diagram in FIG. 7 is therefore used only for illustration. Since fb2 is evaluated together over all phases, this corresponds to an evaluation at the chopper frequency.

It should be noted that the calculation of the correction signal c by means of counters is only one example, and it is also possible to use other possibilities to calculate the correction signal c substantially on the basis of equations (5) to (7), for example approaches which use accumulators.

Figure 6:
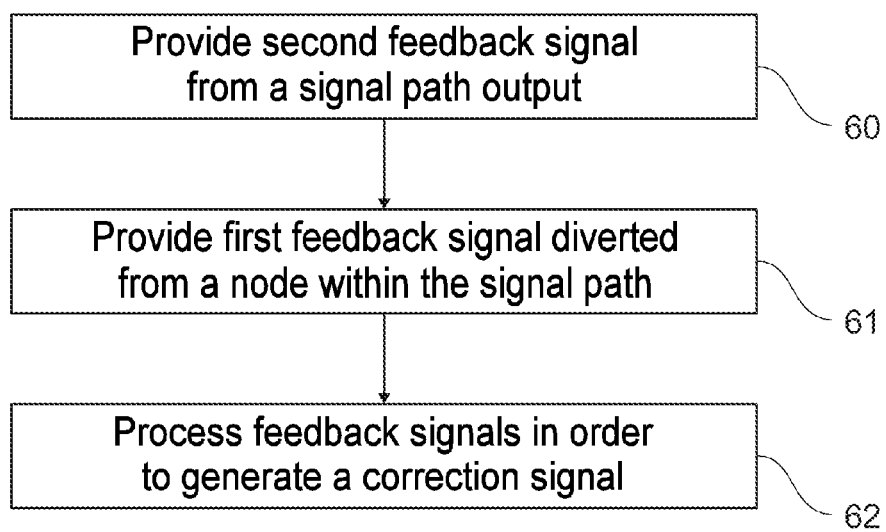
FIG. 6 shows a flowchart for illustrating methods according to some example embodiments.

FIG. 6 is a flowchart for illustrating a method according to some example embodiments. The method in FIG. 6 can be carried out, for example, using the magnetic field sensor apparatuses discussed with reference to FIGS. 1, 3 and 5, but can also be implemented in other magnetic field sensor apparatuses. In order to simplify the description, the method in FIG. 6 is described with reference to the above description of the apparatuses.

At 60, the method comprises provision of a second feedback signal from an output of a main signal path which is coupled to a Hall sensor, wherein the Hall sensor is operated using a spinning current method. This corresponds to the provision of the feedback signal fb2 in FIGS. 1, 3 and 5.

At 61, the method comprises provision of a first feedback signal which is diverted from an intermediate node of the main signal path (for example from the node between the components 12 and 13 in FIG. 1, the components 32 and 33 in FIG. 3 or from the transistor 55 in FIG. 5). In example embodiments, the first feedback signal (fb1) thereby has a shorter signal propagation time than the second feedback signal (fb2).

At 62, the method comprises processing of the first and second feedback signals, in particular digital processing, in order to form a correction signal (for example the correction signal c in FIGS. 1, 3 and 5). In this case, the processing can be carried out as described above on the basis of equations (5) to (7), for example by means of counters as illustrated in FIG. 5. The other variants and modifications described with reference to FIGS. 1 to 5 can also be applied in a corresponding manner to the method.

It should be noted that the first and second feedback signals can be provided at 60 and 61 at substantially the same time, as shown in the various magnetic field sensor apparatuses, with the result that the sequence of the different operations which is illustrated in FIG. 6 should not be interpreted as being restrictive here.

Some example embodiments are defined by the following examples:

Example 1. A signal processing circuit comprising:
a combiner for receiving an output signal from a four-phase spinning current Hall sensor and a correction signal and for combining the output signal and the correction signal to form a corrected signal,
a main signal path which is configured to receive the corrected signal and to output an output signal,
a second signal path which branches off from a node within the main signal path and is configured to provide a first feedback signal, wherein the second signal path has a shorter signal propagation time than the main signal path, and
a processing device which is configured to generate the correction signal for reducing ripple in the output signal on the basis of the first feedback signal and the output signal as a second feedback signal.

Example 2. The signal processing circuit according to example 1, wherein the processing device comprises an analog/digital converter, a digital circuit for determining a digital version of the correction signal and a digital/analog converter for providing the correction signal from the digital version of the correction signal.

Example 3. The signal processing circuit according to example 2, wherein the processing circuit comprises a multiplexer device for receiving the first feedback signal and the second feedback signal and for optionally forwarding the first feedback signal or the second feedback signal to downstream components of the processing device.

Example 4. The signal processing circuit according to example 3, wherein the processing device comprises a track-and-hold device which is connected downstream of the multiplexer device and the output of which is coupled to an input of the digital/analog converter.

Example 5. The signal processing circuit according to one of examples 2 to 4, wherein the digital circuit comprises a two-phase counter, which determines a first component of the digital version of the correction signal on the basis of the first feedback signal, and a four-phase counter, which is configured to determine a second component of the digital version of the correction signal on the basis of the second feedback signal, and an addition component which is configured to combine the first and second components.

Example 6. The signal processing circuit according to one of examples 1 to 5, wherein the processing device is configured to determine a first offset component on the basis of the first feedback signal and to determine a second offset component on the basis of the second feedback signal, wherein the correction signal is based on the first offset component and the second offset component.

Example 7. The signal processing circuit according to one of examples 1 to 6, wherein the main signal path comprises a voltage/current converter, current range components connected downstream of the voltage/current converter and a voltage/current converter, wherein the node is between the voltage/current converter and the current/voltage converter, and
wherein the second signal path comprises a further current/voltage converter.

Example 8. The signal processing circuit according to example 7, wherein the current range components comprise a first number of current mirrors.

Example 9. The signal processing circuit according to example 8, wherein the second signal path comprises a second number of current mirrors.

Example 10. The signal processing circuit according to example 9, wherein the first number of current mirrors and the second number of current mirrors have a common input transistor.

Example 11. The signal processing circuit according to example 9 or 10, wherein the second number is lower than the first number.

Example 12. A magnetic field sensor apparatus comprising:
a signal processing circuit according to one of examples 1 to 11, and
the four-phase spinning current Hall sensor.

Example 13. A signal processing method comprising:
providing a second feedback signal at an output of a main signal path which receives a four-phase spinning current Hall signal,
providing a first feedback signal which is diverted from a node within the main signal path, wherein the first feedback signal is provided with a shorter signal propagation time than the second feedback signal, and
generating a correction signal for the four-phase spinning current Hall signal on the basis of the first feedback signal and the second feedback signal.

Example 14. The method according to example 13, wherein the correction signal is generated by means of at least partially digital processing.

Example 15. The method according to example 13 or 14, also comprising receiving the first feedback signal and
multiplexing in order to optionally forward the first feedback signal or the second feedback signal to downstream processing.

Example 16. The method according to example 15, wherein the optional forwarding is effected to a track-and-hold device with a downstream analog/digital converter.

Example 17. The method according to one of examples 13 to 16, wherein the generation of the correction signal comprises a first counting operation on the basis of the first feedback signal in order to determine a first component and a second counting operation on the basis of the second feedback signal in order to determine a second component and an operation of combining the first and second components.

Example 18. The method according to one of examples 13 to 17, wherein the generation of the correction signal comprises determining a first offset component on the basis of the first feedback signal and a second offset component on the basis of the second feedback signal, wherein the correction signal is based on the first offset component and the second offset component.

Example 19. The method according to one of examples 13 to 18, wherein the main signal path comprises a voltage/current converter, current range components connected downstream of the voltage/current converter and a voltage/current converter, wherein the node is between the voltage/current converter and the current/voltage converter, and wherein a second signal path for providing the first feedback signal comprises a further current/voltage converter (35).

Example 20. The method according to one of examples 13 to 18, wherein the provision of the second feedback signal comprises voltage/current conversion in order to generate a current signal, processing of the current signal in the current range in order to generate a processed current signal, and current/voltage conversion of the processed current signal, and the provision of the first feedback signal comprises further current/voltage conversion on the basis of the current signal.

Although specific example embodiments have been illustrated and described in this description, persons with conventional expert knowledge will recognize that a multiplicity of alternative and/or equivalent implementations can be selected as a substitute for the specific example embodiments which are shown and described in this description without departing from the scope of the invention shown. The intention is for this application to cover all adaptations or variations of the specific example embodiments which are discussed here. The intention is therefore for this invention to be restricted only by the claims and the equivalents of the claims.

What is claimed is:

1. A signal processing circuit, comprising:
a combiner configured to receive a first output signal from a four-phase spinning current Hall sensor and a correction signal, and combine the first output signal and the correction signal to form a corrected signal;
a main signal path configured to receive the corrected signal and output a second output signal;
a second signal path that branches off from a node within the main signal path and is configured to provide a first feedback signal, wherein the second signal path has a shorter signal propagation time than the main signal path; and
a processing device configured to receive the first feedback signal and the second output signal as a second feedback signal, and generate the correction signal for reducing ripple in the first output signal based on the first feedback signal and the second output signal used by the processing device as the second feedback signal.

2. The signal processing circuit as claimed in claim 1, wherein the processing device comprises an analog/digital converter, a digital circuit configured to determine a digital version of the correction signal, and a digital/analog converter configured to provide the correction signal from the digital version of the correction signal.

3. The signal processing circuit as claimed in claim 2, wherein the processing device comprises a multiplexer device configured to receive the first feedback signal and the second feedback signal and forward the first feedback signal or the second feedback signal to downstream components of the processing device.

4. The signal processing circuit as claimed in claim 3, wherein the processing device comprises a track-and-hold device that is connected downstream of the multiplexer device, the track-and-hold device comprising an output that is coupled to an input of the digital/analog converter.

5. The signal processing circuit as claimed in claim 2, wherein the digital circuit comprises a two-phase counter, which determines a first component of the digital version of the correction signal based on the first feedback signal, and a four-phase counter, which is configured to determine a second component of the digital version of the correction signal based on the second feedback signal, and an addition component which is configured to combine the first and the second components of the digital version of the correction signal.

6. The signal processing circuit as claimed in claim 1, wherein the processing device is configured to determine a first offset component based on the first feedback signal and to determine a second offset component based on the second feedback signal, wherein the correction signal is based on the first offset component and the second offset component.

7. The signal processing circuit as claimed in claim 1, wherein the main signal path comprises a voltage/current converter, current range components connected downstream of the voltage/current converter, and a current/voltage converter, wherein the node is between the voltage/current converter and the current/voltage converter, and wherein the second signal path comprises a further current/voltage converter.

8. The signal processing circuit as claimed in claim 7, wherein the current range components comprise a first number of current mirrors.

9. The signal processing circuit as claimed in claim 8, wherein the second signal path comprises a second number of current mirrors.

10. The signal processing circuit as claimed in claim 9, wherein the first number of current mirrors and the second number of current mirrors have a common input transistor.

11. The signal processing circuit as claimed in claim 9, wherein the second number is lower than the first number.

12. A magnetic field sensor apparatus, comprising:
a signal processing circuit; and
a four-phase spinning current Hall sensor,
wherein the signal processing circuit comprises:
a combiner configured to receive a first output signal from the four-phase spinning current Hall sensor and a correction signal, and combine the first output signal and the correction signal to form a corrected signal;
a main signal path configured to receive the corrected signal and output a second output signal;
a second signal path that branches off from a node within the main signal path and is configured to provide a first feedback signal, wherein the second signal path has a shorter signal propagation time than the main signal path; and
a processing device configured to receive the first feedback signal and the second output signal as a second feedback signal, and generate the correction signal for reducing ripple in the first output signal based on the first feedback signal and the second output signal used by the processing device as the second feedback signal.

13. A signal processing method, comprising:
combining a first output signal from a four-phase spinning current Hall sensor and a correction signal to form a corrected signal, wherein the first output signal is a four-phase spinning current Hall signal;
providing the corrected signal to a main signal path;
outputting a second output signal from an output of the main signal path;
providing the second output signal as a second feedback signal from the output of the main signal path;

providing a first feedback signal which is diverted from a node within the main signal path, wherein the first feedback signal is provided with a shorter signal propagation time than the second feedback signal; and generating the correction signal for reducing ripple in the first output signal based on the first feedback signal and the second feedback signal.

14. The signal processing method as claimed in claim 13, wherein the correction signal is generated by means of at least partially digital processing.

15. The signal processing method as claimed in claim 13, further comprising:

receiving the first feedback signal; and multiplexing in order to forward the first feedback signal or the second feedback signal to downstream processing.

16. The signal processing method as claimed in claim 15, further comprising:

forwarding the first feedback signal and the second feedback signal via the multiplexing to a track-and-hold device with a downstream analog/digital converter.

17. The signal processing method as claimed in claim 13, wherein generating the correction signal comprises a first counting operation based on the first feedback signal in order to determine a first component of the correction signal, a second counting operation based on the second feedback signal in order to determine a second component of the correction signal, and a combining operation of combining the first and the second components of the correction signal.

18. The signal processing method as claimed in claim 13, wherein generating the correction signal comprises determining a first offset component based on the first feedback signal and a second offset component based on the second feedback signal, wherein the correction signal is based on the first offset component and the second offset component.

19. The signal processing method as claimed in one of claim 13, wherein the main signal path comprises a voltage/current converter, current range components connected downstream of the voltage/current converter, and a current/voltage converter, wherein the node is between the voltage/current converter and the current/voltage converter, and wherein a second signal path for providing the first feedback signal comprises a further current/voltage converter.

20. The signal processing method as claimed in claim 13, wherein providing the second feedback signal comprises voltage/current conversion in order to generate a current signal, processing of the current signal in a current range in order to generate a processed current signal, and current/voltage conversion of the processed current signal, and providing the first feedback signal comprises a further current/voltage conversion based on the current signal.

* * * * *